United States Patent
Sokolov et al.

(10) Patent No.: US 9,317,461 B2
(45) Date of Patent: Apr. 19, 2016

(54) USE OF HOST SYSTEM RESOURCES BY MEMORY CONTROLLER

(71) Applicant: Apple Inc., Cupertino, CA (US)

(72) Inventors: Dotan Sokolov, Ra'anana (IL); Barak Rotbard, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/452,743

(22) Filed: Aug. 6, 2014

(65) Prior Publication Data

US 2014/0344498 A1    Nov. 20, 2014

Related U.S. Application Data

(63) Continuation of application No. 12/728,287, filed on Mar. 22, 2010, now Pat. No. 8,832,354.

(60) Provisional application No. 61/163,133, filed on Mar. 25, 2009.

(51) Int. Cl.
*G06F 12/02* (2006.01)
*G06F 13/28* (2006.01)
*G11C 16/10* (2006.01)

(52) U.S. Cl.
CPC ............ *G06F 13/28* (2013.01); *G06F 12/0246* (2013.01); *G11C 16/10* (2013.01); *G06F 2212/1041* (2013.01); *G06F 2212/7201* (2013.01); *G06F 2212/7203* (2013.01); *G06F 2212/7205* (2013.01); *G06F 2212/7211* (2013.01); *Y02B 60/1225* (2013.01)

(58) Field of Classification Search
CPC ................ G06F 13/28; G06F 12/0246; G06F 2212/7205; G06F 2212/7211; G06F 2212/1041; G06F 2212/7201; G06F 2212/7203; G11C 16/10; Y02B 60/1225
See application file for complete search history.

(56) References Cited

U.S. PATENT DOCUMENTS

| | | | |
|---|---|---|---|
| 5,802,069 | A  | 9/1998  | Coulson |
| 6,038,636 | A  | 3/2000  | Brown, III et al. |
| 6,882,568 | B2 | 4/2005  | Shiota et al. |
| 8,291,151 | B2 | 10/2012 | Sinclair |
| 8,327,040 | B2 | 12/2012 | Feeley et al. |

(Continued)

OTHER PUBLICATIONS

International Preliminary Report on Patentability from PCT/US2013/056069, issued Mar. 5, 2015, Apple Inc., pp. 1-7.

(Continued)

*Primary Examiner* — Kevin Verbrugge
*Assistant Examiner* — Rocio Del Mar Perez-Velez
(74) *Attorney, Agent, or Firm* — Meyertons, Hood, Kivlin, Kowert & Goetzel, P.C.

(57) ABSTRACT

A method for data storage includes, in a system that includes a host having a host memory and a memory controller that is separate from the host and stores data for the host in a non-volatile memory including multiple analog memory cells, storing in the host memory information items relating to respective groups of the analog memory cells of the non-volatile memory. A command that causes the memory controller to access a given group of the analog memory cells is received from the host. In response to the command, a respective information item relating to the given group of the analog memory cells is retrieved from the host memory by the memory controller, and the given group of the analog memory cells is accessed using the retrieved information item.

20 Claims, 2 Drawing Sheets

(56) References Cited

U.S. PATENT DOCUMENTS

| | | | |
|---|---|---|---|
| 2002/0161984 A1* | 10/2002 | Lloyd-Jones | G06F 12/0238 711/203 |
| 2005/0180213 A1* | 8/2005 | Abe et al. | 365/185.17 |
| 2006/0039196 A1* | 2/2006 | Gorobets | G06F 11/106 365/185.01 |
| 2007/0130421 A1 | 6/2007 | Ahmad et al. | |
| 2007/0233939 A1 | 10/2007 | Kim | |
| 2008/0086619 A1 | 4/2008 | Traister et al. | |
| 2008/0126712 A1 | 5/2008 | Mizushima | |
| 2008/0181001 A1* | 7/2008 | Shalvi | 365/185.03 |
| 2008/0189485 A1* | 8/2008 | Jung | G06F 12/0246 711/115 |
| 2009/0157949 A1 | 6/2009 | Leibowitz | |
| 2009/0248964 A1 | 10/2009 | Yano et al. | |
| 2010/0191874 A1* | 7/2010 | Feeley et al. | 710/24 |
| 2011/0022789 A1 | 1/2011 | Fujimoto | |

OTHER PUBLICATIONS

Non-final Office Action, Taiwan Application No. 102130319, mailed Jul. 17, 2015, 15 pages.

Notice of Preliminary Rejection Korean Patent Application No. 10-2015-7004770 mailed Jan. 20, 2016.

* cited by examiner

USE OF HOST SYSTEM RESOURCES BY MEMORY CONTROLLER

CROSS-REFERENCE TO RELATED APPLICATIONS

This application is a continuation of U.S. patent application Ser. No. 12/728,287, filed Mar. 22, 2010, which claims the benefit of U.S. Provisional Patent Application 61/163,133, filed Mar. 25, 2009, whose disclosure is incorporated herein by reference.

TECHNICAL FIELD

Embodiments described herein are related to the field of data storage, and particularly to memory controllers that use host system resources.

BACKGROUND

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

SUMMARY OF THE EMBODIMENTS

An embodiment of the present invention provides a method for data storage, including:

in a system that includes a host having a host memory and a memory controller that is separate from the host and stores data for the host in a non-volatile memory including multiple analog memory cells, storing in the host memory information items relating to respective groups of the analog memory cells of the non-volatile memory;

receiving from the host a command that causes the memory controller to access a given group of the analog memory cells; and in response to the command, retrieving from the host memory by the memory controller a respective information item relating to the given group of the analog memory cells, and accessing the given group of the analog memory cells using the retrieved information item.

In some embodiments, the host memory includes a Random Access Memory (RAM). In an embodiment, the information items includes read thresholds, and accessing the given group includes reading the memory cells in the group using one or more read thresholds retrieved from the host memory. In a disclosed embodiment, the information items include erase thresholds, and accessing the given group includes erasing the memory cells in the given group using one or more erase thresholds retrieved from the host memory. In another embodiment, the analog memory cells are programmed using a programming process, the information items include parameters of the programming process, and accessing the given group includes programming the given group using one or more of the parameters that are retrieved from the host memory. In an embodiment, the programming process includes an iterative Programming and Verification (P&V) process.

In yet another embodiment, the information items are indicative of wear levels of the respective groups of the analog memory cells. In still another embodiment, the information items are indicative of distortion levels in the respective groups of the analog memory cells. In an embodiment, the information items specify at least one attribute selected from a set of attributes consisting of a number of programming states, an Error Correction Code (ECC) and an ECC block size to be used in programming the respective groups of the analog memory cells. In an embodiment, the information items specify a relation between logical addresses and physical storage locations of the respective groups of the analog memory cells. In another embodiment, the information items are indicative of data stored in memory cells that neighbor the respective groups of the analog memory cells.

In some embodiments, receiving the command includes communicating between the memory controller and the host over a first physical interface, and retrieving the information item includes communicating between the memory controller and the host memory over a second physical interface, separate from the first physical interface. In an embodiment, retrieving the information item includes fetching the information item by the memory controller without execution of any operations by the host relating to retrieval of the information item. In another embodiment, reception of the command and retrieval of the information item are performed over a common physical interface that connects the memory controller and the host. In some embodiments, the common physical interface may conform to one of a NAND interface specification, a Micro-SD (µSD) interface specification, an Embedded Multi-Media Card (eMMC) interface specification, a Universal Flash Storage (UFS) interface specification, a Serial Advanced Technology Attachment (SATA) interface specification, a Universal Serial Bus (USB) interface specification and a Peripheral Component Interconnect (PCI) interface.

In a disclosed embodiment, storing the information items and retrieving the information item include:

using a hardware signal, sending a request from the memory controller to the host to exchange one or more information items with the memory controller; and responsively to the request, initiating exchange of the one or more information items by the host.

In an embodiment, storing the information items includes sending the information items in responses sent from the memory controller to the host, and retrieving the information item includes sending the information item in a host command sent from the host to the memory controller.

There is additionally provided, in accordance with an embodiment of the present invention, a method for data storage, including:

in a system that includes a host and a memory controller that is separate from the host and stores data for the host in a non-volatile memory, assigning a resource of the host for use by the memory controller;

receiving from the host a command that causes the memory controller to access the non-volatile memory; and in response to the command, accessing the non-volatile memory using the assigned resource of the host.

In some embodiments, assigning the resource includes assigning logic circuitry in the host, and accessing the non-volatile memory includes applying the logic circuitry to process data that is accessed by the command. In another embodiment, assigning the resource includes providing supply voltage to the memory controller by the host. In yet another embodiment, accessing the non-volatile memory includes reading data from the non-volatile memory, and invoking the host to cancel interference in the read data. Accessing the non-volatile memory may include reading from the non-volatile memory data that is encoded with an Error Correction Code (ECC), and invoking the host to decode the ECC. In an embodiment, invoking the host includes making an attempt to decode the ECC using a first decoder in the memory controller, and, responsively to a failure of the attempt, invoking a second decoder in the host to decode the ECC. In another embodiment, assigning the resource includes assigning memory space in the host, and accessing the non-volatile memory includes caching multiple pages in the memory space assigned in the host, and copying the multiple cached pages sequentially to the non-volatile memory.

There is also provided, in accordance with an embodiment of the present invention, a data storage apparatus, including:

a first interface, which is configured to communicate with a non-volatile memory that includes multiple analog memory cells;

a second interface, which is configured to communicate with a host having a host memory; and a processor, which is configured to store in the host memory information items relating to respective groups of the analog memory cells of the non-volatile memory, to receive from the host a command that causes the processor to access a given group of the analog memory cells, and, in response to the command, to retrieve from the host memory a respective information item relating to the given group of the analog memory cells and to access the given group of the analog memory cells using the retrieved information item.

There is further provided, in accordance with an embodiment of the present invention, a data storage apparatus, including:

a first interface, which is configured to communicate with a non-volatile memory;

a second interface, which is configured to communicate with a host; and a processor, which is configured to receive from the host a command for accessing the non-volatile memory, and to access the non-volatile memory in response to the command using a pre-assigned resource of the host.

There is additionally provided, in accordance with an embodiment of the present invention, a data storage apparatus, including:

a non-volatile memory including multiple analog memory cells; and a processor, which is configured to communicate with a host having a host memory, to store in the host memory information items relating to respective groups of the analog memory cells of the non-volatile memory, to receive from the host a command that causes the processor to access a given group of the analog memory cells, and, in response to the command, to retrieve from the host memory a respective information item relating to the given group of the analog memory cells and to access the given group of the analog memory cells using the retrieved information item.

The present invention will be more fully understood from the following detailed description of the embodiments thereof, taken together with the drawings in which:

DETAILED DESCRIPTION OF EMBODIMENTS

Overview

In some data storage applications, a memory controller is connected to a host system and stores data for the host system in a non-volatile memory. For example, a mobile phone or media player may store data in a Micro-Secure Digital (µSD) card, Embedded Multi-Media Card (eMMC) or Universal Flash Storage (UFS) device. In many cases, the host system has more hardware resources (e.g., memory space and computational power) than the internal resources of the memory controller. Embodiments of the present invention that are described hereinbelow provide improved methods and systems for data storage. In these methods and systems, the memory controller uses hardware resources of the host system in order to access the non-volatile memory.

In some embodiments, a memory controller stores data for a host in a non-volatile memory comprising multiple analog memory cells. The host has a host memory, e.g., a Dynamic Random Access Memory (DRAM). The host memory holds information items relating to respective groups of the analog memory cells, e.g., information items relating to erasure blocks, word lines or pages of the non-volatile memory. The memory controller receives a command from the host, which causes the memory controller to access a given group of the analog memory cells. In response to this command, the memory controller retrieves from the host memory an information item that corresponds to the given group of analog memory cells, and accesses the memory cells in the given group using the retrieved information item.

Various examples of information items that can be stored in the host memory, such as storage parameters and configurations for respective groups of memory cells, and/or logical-to-physical address translation tables, are described herein. In some embodiments, data for storage is accumulated in the host memory, and then copied sequentially to the non-volatile memory. Several examples of interfaces between the memory controller and the host memory, either directly or via the host, are also described.

The methods and systems described herein increase the performance of memory controllers, e.g., programming and readout speed, by enabling them to exploit the hardware resources of the host system when performing memory access operations. Since the internal hardware resources of memory controllers can be reduced when using the disclosed techniques, memory controller cost, size and power consumption can be reduced, as well.

System Description

Figure 1:
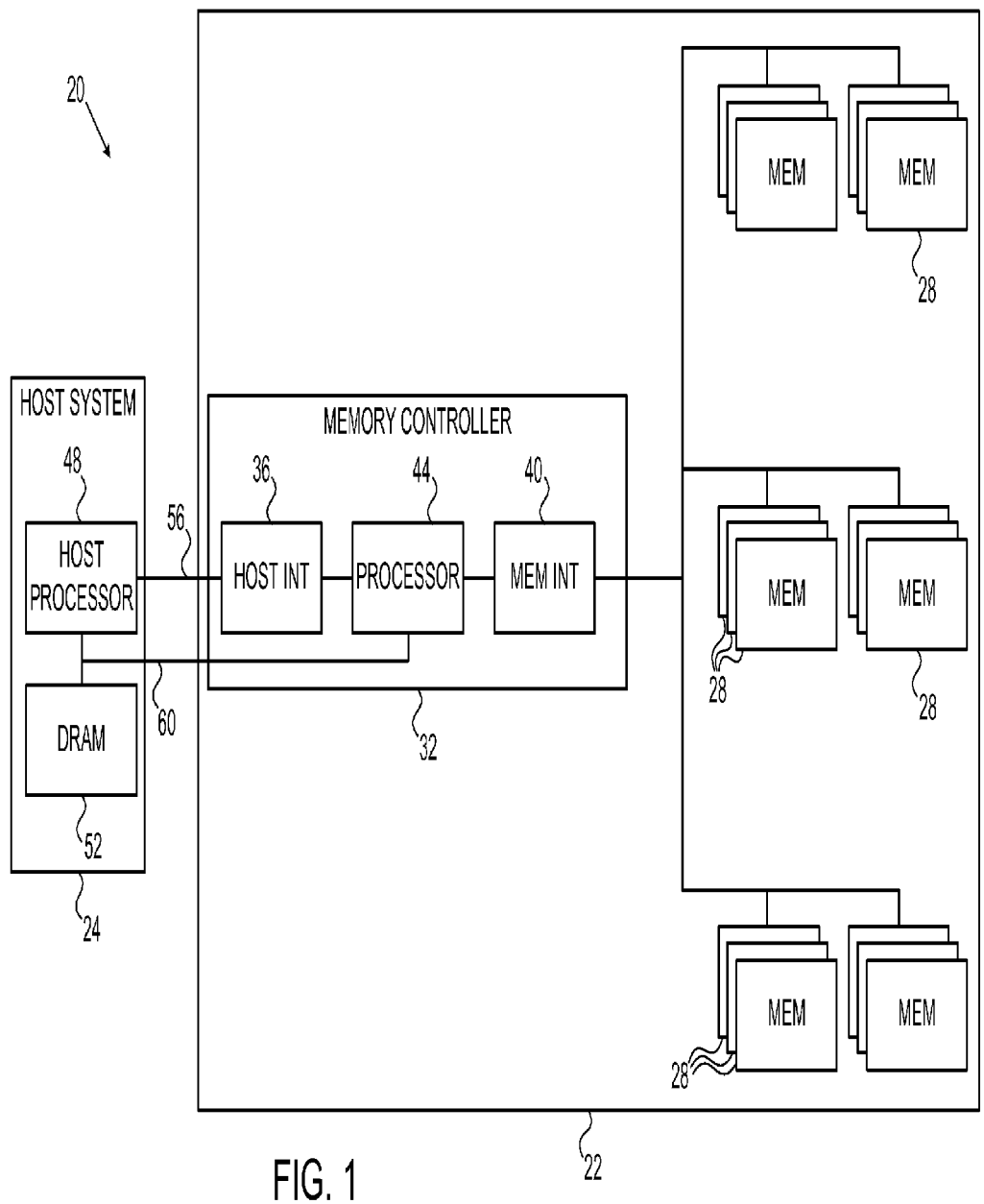
FIG. 1 is a block diagram that schematically illustrates a data storage system, in accordance with an embodiment of the present invention.

FIG. 1 is a block diagram that schematically illustrates a data storage system 20, in accordance with an embodiment of the present invention. System 20 comprises a memory system 22 and a host system 24. Memory system 22 accepts data for storage from host system 24 and stores it in memory, and retrieves data from memory and provides it to the host system. In the present example, system 22 comprises a Micro-Secure Digital (pSD) card Solid-State Disk (SSD) that stores data for a cellular phone, media player, digital camera or other host. In alternative embodiments, however, system 22 may be used in any other suitable application and with any other suitable host system, such as in computing devices such as mobile computers, WiFi terminals or other communication terminals, Global Positioning System (GPS) units, removable memory modules such as Disk-On-Key (DOK) devices, Secure Digital (SD) cards, Multi-Media Cards (MMC) and embedded MMC (eMMC), digital cameras, music and other media players such as Portable Media Players (PMP), and/or any other system or device in which data is stored and retrieved.

Memory system 22 comprises multiple memory devices 28, each comprising multiple analog memory cells. In the present example, devices 28 comprise non-volatile NAND Flash devices, although any other suitable memory type, such as NOR and Charge Trap Flash (CTF) Flash cells, phase change RAM (PRAM, also referred to as Phase Change Memory—PCM), Nitride Read Only Memory (NROM), Ferroelectric RAM (FRAM) and/or magnetic RAM (MRAM) can also be used.

In the context of the present patent application and in the claims, the term "analog memory cell" is used to describe any memory cell that holds a continuous, analog value of a physical parameter, such as an electrical voltage or charge. Any suitable type of analog memory cells, such as the types listed above, can be used. In the present example, each memory device 28 comprises a non-volatile memory of NAND Flash cells. The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 22 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The memory cells are typically arranged in rows and columns. Typically, a given memory device comprises multiple erasure blocks (also referred to as memory blocks), i.e., groups of memory cells that are erased together.

Each memory device 28 may comprise a packaged device or an unpackaged semiconductor chip or die. Generally, memory system 22 may comprise any suitable number of memory devices of any desired type and size. Although the system configuration of FIG. 1 comprises multiple memory devices, some of the methods and systems described herein can also be used in systems having only a single memory device.

Memory system 22 comprises a memory controller 32, which accepts data from host system 24 and stores it in memory devices 28, and retrieves data from the memory devices and provides it to the host system. Memory controller 32 comprises a host interface 36 for communicating with host system 24, a memory interface 40 for communicating with memory devices 28, and a processor that processes the stored and retrieved data. For example, processor 44 may encode the data for storage with an Error Correction Code (ECC) and decode the ECC of data read from memory. The functions of processor 44 can be implemented, for example, using software running on a suitable Central Processing Unit (CPU), using hardware (e.g., state machine or other logic), or using a combination of software and hardware elements.

In some embodiments, memory controller 32 uses hardware resources of host system 24 for performing memory access operations (e.g., read or write operations) that access memory devices 28. In the embodiment of FIG. 1, host system 24 comprises a host processor 48 and a host memory, in the present example comprising a Dynamic Random Access Memory (DRAM) 52. DRAM 52 may be used by host processor 48 for storing data, for storing program instructions or for any other purpose. In some embodiments, some of the storage space in DRAM 52 is used for storing information used by memory controller 32. In the example of FIG. 1, memory controller 32 communicates with host processor 48 (via host interface 36) using a host bus 56. In addition, processor 44 of memory controller 32 communicates directly with DRAM 52 using a dedicated interface 60. In alternative embodiments, memory controller 32 communicates with host processor 48 and with DRAM 52 using host bus 56, in which case interface 60 is omitted.

Memory controller 32, and in particular processor 44, may be implemented in hardware. Alternatively, the memory controller may comprise a microprocessor that runs suitable software, or a combination of hardware and software elements. In some embodiments, processor 44 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

The system configuration of FIG. 1 is an example configuration, which is shown purely for the sake of conceptual clarity. Any other suitable memory system configuration can also be used. For example, in some embodiments two or more memory controllers 32 may be connected to the same host processor. Although the embodiments described herein refer to DRAM, host system may comprise any other suitable type of volatile and/or non-volatile host memory. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 28 and memory controller 32 are implemented as separate Integrated Circuits (ICs). In alternative embodiments, however, the memory devices and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which one or more of the memory devices are disposed. Further alternatively, some or all of the functionality of memory controller 32 can be implemented in software and carried out by host processor 48 or other element of host system 24, or by any other type of memory controller. In some embodiments, host processor 48 and Memory controller 32 may be fabricated on the same die, or on separate dies in the same device package.

Data Storage in Non-Volatile Memory Using Host System Resources

In many practical applications, host system 24 has considerably more hardware resources than those available internally in memory controller 32. In some mobile phones, for example, memory controller 32 comprises a SD or eMMC controller having limited memory resources and limited computational power. The host system, on the other hand, often comprises a powerful processor and considerable DRAM storage space. In some embodiments of the present invention, memory controller 32 uses the richer hardware resources of host system 24 for accessing memory devices 28. In the example of FIG. 1 the hardware resource comprises host memory (DRAM) storage space, although various other hardware resources of the host system can also be used.

In some embodiments, storage space is assigned in DRAM 52 for storing information items that are used by memory controller 32 in accessing memory devices 28. In addition, the memory controller supports one or more operations that access memory devices 28 using the information items stored in the DRAM. The information items may comprise, for example, storage parameters and configurations, logical-to-physical address translation tables or any other information that is useful for the memory controller in accessing (e.g., reading, writing or erasing) the memory devices. When executing a given operation of this sort, usually in response to a host command, the memory controller retrieves the appropriate information from DRAM 52 and then accesses memory devices 28 using the retrieved information.

In some embodiments, the information items stored in DRAM 52 comprise storage parameters for respective groups of memory cells. Information items may be stored per memory device, per memory die, per erasure block, per word line or page, or per any other suitable group of memory cells. When preparing to access (e.g., read, write or erase) a given group of memory cells in devices 28, the memory controller retrieves the storage parameters of this memory cell group from DRAM 52, and then accesses the memory cells in the group using the retrieved storage parameters. Since the available storage space in DRAM 52 is often considerably larger than the internal storage space in processor 44, this technique enables the memory controller to better match the storage parameters to the actual group of memory cells being accessed. Any suitable storage parameters can be used.

For example, memory devices 28 may comprise analog memory cells (e.g., Flash cells) that are read by comparing their storage values to certain read thresholds. In these embodiments, memory controller 32 may store read threshold values for different groups of memory cells (e.g., for different erasure blocks) in DRAM 52. The memory controller supports a read operation, which reads data from a certain group of memory cells in devices 28 by retrieving the read threshold values applicable to this group from DRAM 52, and then reading the data from the group using the retrieved read thresholds.

As another example, the memory cells in memory devices 28 may be programmed using an iterative Programming and Verification (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached. In some embodiments, parameters of the P&V process that are applicable to different groups of memory cells are stored in DRAM 52 of host system 24. The memory controller supports a write operation, which stores data in a certain group of memory cells by retrieving the corresponding P&V parameters from DRAM 52, and then programming the group of memory cells using the retrieved P&V parameters.

P&V parameters that may be stored in DRAM 52 may comprise, for example, verification thresholds that are used for verifying the storage values written into the memory cells, incremental step sizes (i.e., the increment between successive programming pulses, also referred to as Incremental Step Pulse Programming—ISPP), initial programming pulse magnitudes, and/or any other suitable parameter.

As yet another example, the memory cells in devices 28 may be erased and then verified against certain erase verification thresholds. In some embodiments, the memory controller stores different erase verification threshold values for different memory cell groups in DRAM 52. The memory controller may support an erase operation, which retrieves the erase verification threshold values of this cell group from DRAM 52 and erases the cell group using the retrieved thresholds.

Other examples of information items that can be stored in DRAM 52 are indicative of the wear level or health level of respective groups of memory cells in devices 28, or other historic figures-of-merit of the memory cells. Such information items may comprise, for example, the number of Programming and Erasure (P/E) cycles that each group of memory cells has gone through, or the time that elapsed since the last programming of each group of memory cells.

Other information items may be indicative of the level of distortion present in each group of memory cells in devices 28. Such parameters may comprise, for example, an estimate of cross-coupling interference, an estimated drift of the cells' storage values, or an estimated temperature-time integral (the operating temperature integrated over time) for different groups of memory cells. Yet another example of an information item that can be stored in DRAM 52 comprises the index of the last page that was stored in each erasure block. All of these information items may be useful in determining the way the memory cells are read and/or programmed. Example techniques of this sort are described, for example, in PCT International Publications WO 2007/132453, WO 2007/132457, WO 2008/026203, WO 2008/053472 and WO 2008/111058, whose disclosures are incorporated herein by reference.

In some embodiments, memory controller 32 stores data in different groups of memory cells in devices 28 using different storage configurations. For example, the memory controller may modify the number of programming states (programming levels) and/or the Error Correction Code (ECC) from one memory cell group to another. Example techniques of this sort are described, for example, in PCT International Publication WO 2007/132456, whose disclosure is incorporated herein by reference. As another example, the memory controller may use different ECC block sizes, e.g., in order to provide different trade-offs between error correction capability and latency. In an example embodiment, the memory controller may encode some pages using 2 KB blocks, and other pages using 4 KB blocks.

In some embodiments, memory controller 32 stores in DRAM 52 the storage configurations to be applied in different memory cells groups of devices 28 (e.g., the number of programming levels, the type of ECC and/or the ECC block size to be used in each erasure block, word line or page). The memory controller supports read and write operations that retrieve the storage configuration for a given memory cell group from DRAM 52, and then read or program the cell group using the retrieved storage configuration.

In some embodiments, the memory controller receives from host system 24 read/write commands that are specified using logical addresses (also referred to as virtual addresses). The memory controller translates the logical addresses into physical storage locations in memory devices 28, and reads or writes the data to or from the appropriate physical storage locations. Translation between logical addresses and physical storage locations is typically performed by querying translation tables that are managed by the memory controller.

In some embodiments, memory controller 32 stores the mapping between logical addresses and physical storage locations in DRAM 52. The logical-physical mapping may be represented by one or more tables, or using any other suitable data structure. The mapping may map logical addresses to physical storage locations, physical storage locations to logical addresses, or both. In these embodiments, the memory controller supports read and write operations that translate between logical addresses and physical storage locations by querying the mapping stored in DRAM 52.

For example, in response to a read command from the host system that requests readout from a given range of logical addresses, the memory controller may execute a read operation that queries the mapping in DRAM 52 so as to obtain the physical storage locations that correspond to the requested logical addresses. Then, the operation reads the data from these physical storage locations in memory devices 28. A similar flow can be defined for write operations, as well. This technique enables the memory controller to perform logical-physical address translation with minimal internal memory and without having to store the mapping in non-volatile memory devices 28. The read/write speed of system 22 is improved considerably in comparison with storing the mapping in devices 28. The speed improvement is particularly high when performing a large number of random read/write operations.

Storing the logical-physical address mapping in the host memory is particularly advantageous in memory controller applications having limited internal memory, such as in pSD controllers. When using this technique, read and write operations do not involve extra read and write operations in order to determine the appropriate address translation and/or update the translation. As a result, read and write throughput are increased. In addition, the number of write operations and the amount of read disturb are reduced, and therefore the lifetime of the non-volatile memory is extended.

In many cases, the memory cells in devices 28 suffer from interference, for example cross-coupling interference from neighboring memory cells. In some embodiments, memory controller 32 applies an interference cancellation process when reading data from the memory cells. The interference cancellation process typically estimates and corrects the interference in a given group of memory cells based on the storage values or data of other memory cells (usually neighboring memory cells) in devices 28. Example interference cancellation techniques are described in PCT International Publications WO 2007/132453, WO 2007/132457 and WO 2008/026203, cited above.

In some embodiments, memory controller 32 retrieves the data of neighboring memory cells from DRAM 52. The memory controller supports a read operation that reads data from a given group of memory cells from memory devices 28, retrieves neighboring cell data from DRAM 52, and cancels the interference in the read data using the neighboring cell data obtained from DRAM 52. The neighboring cell data may be available in DRAM 52, for example, from the time the neighboring pages were stored. This technique relieves the memory controller from the need to read the neighboring memory cells from memory devices 28. As a result, the overall reading speed of system 22 can be improved.

In some embodiments, memory controller 32 uses the larger size of DRAM 52 in order to write larger amounts of data to memory devices 28 in a sequential manner. For example, the memory controller may support a block copyback operation that copies multiple pages (e.g., an entire erasure block) from a certain source location to a certain destination location in memory devices 28. When executing this command, the memory controller first reads the multiple pages sequentially from the source location and caches them in DRAM 52. Then, the memory controller reads the multiple pages from DRAM 52 and writes them sequentially to the destination location in memory devices 28. By reading and writing multiple pages sequentially instead of copying one page at a time, the duration of the copyback operation is reduced considerably. As another example, DRAM 52 can be used (either by the memory controller or by the host) to accumulate data for storage that arrives intermittently, until a sequential block of data is produced. The memory controller can then write the accumulated block sequentially to memory devices 28.

Additionally or alternatively, memory controller may store in DRAM 52 any other suitable information, and then use this information in accessing memory devices 28. Although the embodiments described herein refer mainly to DRAM resources, memory controller 32 may use any other suitable hardware resource of host system 24. Example resources are described further below.

Figure 2:
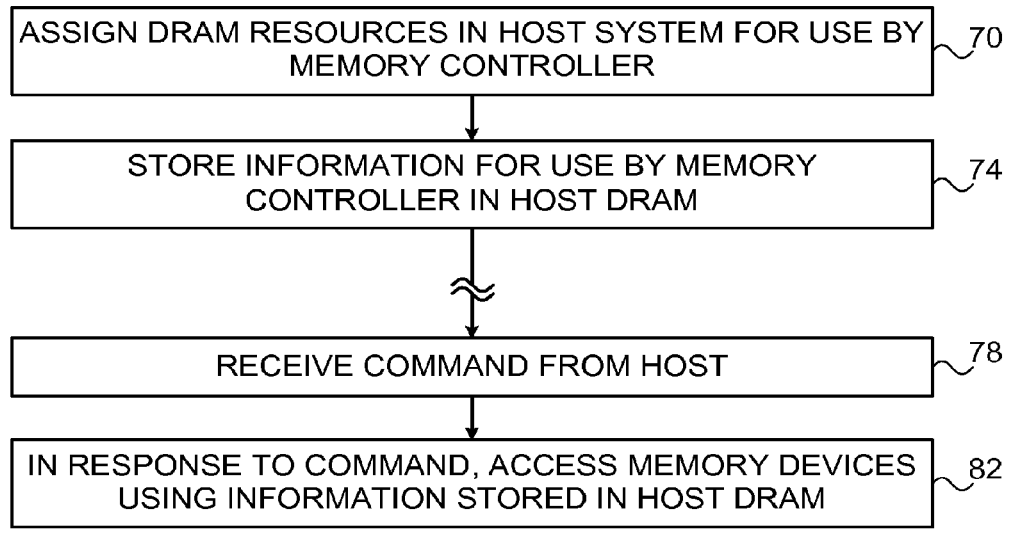
FIG. 2 is a flow chart that schematically illustrates a method for storing data in non-volatile memory using host system resources, in accordance with an embodiment of the present invention.

FIG. 2 is a flow chart that schematically illustrates a method for storing data in non-volatile memory devices 28 by memory controller 32 using DRAM resources of host system 24, in accordance with an embodiment of the present invention. The method begins by assigning storage space in DRAM 52 of host system 24 for use by memory controller 32, at a memory assignment step 70. Memory controller 32 stores in DRAM 52 information items relating to respective groups of analog memory cells of devices 28, at a DRAM storage step 74. As explained above, the information items may comprise storage parameters and configurations, logical-physical address mapping and/or neighboring cell data, for example.

At a certain point in time, memory controller 32 receives a command from host system 24, at a command reception step 78. The command causes the memory controller to access a given group of the analog memory cells of devices 28. For example, the command may request storage or readout of a certain data item. In response to the command, memory controller 32 executes an operation that accesses memory devices 28 using the information retrieved from DRAM 52, at an operation execution step 82. Typically, the memory controller identifies the group of analog memory cells to be accessed in devices 28, retrieves the (one or more) information items pertaining to this memory cell group from DRAM 52, and accesses the memory cells in the group using the retrieved information.

Interfaces Between the Host System and Memory Controller

When carrying out the above-mentioned techniques, memory controller 32 may store and read the information in DRAM 52 using any suitable interface. In the example of FIG. 1 above, the memory controller communicates directly with DRAM 52 using dedicated interface 60 (i.e., using a physical interface that is separate from the physical interface used for communication between the memory controller and the host processor). In these embodiments, retrieving information from DRAM 52 does not involve any operation of the host processor, since the memory controller and DRAM communicate directly. The memory controller and/or host system comprise suitable arbitration logic for controlling access to DRAM 52 by processor 44 and by processor 48.

In alternative embodiments, memory controller 32 stores and reads the information in DRAM 52 using host bus 56 (i.e., over the same physical interface used for communication between the memory controller and the host processor). Host bus 56 may operate in accordance with any suitable standard or protocol, such as, for example, the NAND interface, Micro-SD (pSD) interface, Embedded Multi-Media Card (eMMC) interface, Universal Flash Storage (UFS) interface, Serial Advanced Technology Attachment (SATA) interface, Universal Serial Bus (USB), Peripheral Component Interconnect Express (PCIe), or any other suitable interface.

The μSD interface is specified, for example, in "SD Specifications," Part 1, Physical Layer Specification, Version 3.01 Draft 1.00, Nov. 9, 2009, which is incorporated herein by reference. The eMMC interface is specified, for example, in "Embedded MultiMediaCard (eMMC) Mechanical Standard with Optional Reset Signal," JEDEC Standard JESD84-C44, July, 2009, which is incorporated herein by reference. The UFS interface is specified, for example, in "UFS Specification," version 0.1, Nov. 11, 2009, which is incorporated herein by reference. The SATA interface is specified, for example, in "Serial ATA Revision 3.0," Jun. 2, 2009, which is incorporated herein by reference. The USB interface is specified, for example, in "Universal Serial Bus Specification," Revision 2.0, Apr. 27, 2000, which is incorporated herein by reference.

In the above-listed communication protocols, the host processor is defined as a master and the memory controller is defined as a slave. As such, the memory controller is unable to initiate and send to the host processor commands requesting to store or retrieve information. In some embodiments, memory controller 32 requests host processor 48 to exchange information with DRAM 52, by signaling over a hardware line between the memory controller and the host processor. In some embodiments, a dedicated hardware line may be connected between the memory controller and host processor for this purpose. Alternatively, the memory controller may use an existing hardware line, such as a ready/busy line, for indicating to the host processor that data exchange is requested. Once the host processor receives this indication, it initiates the information exchange process.

Figure 3:
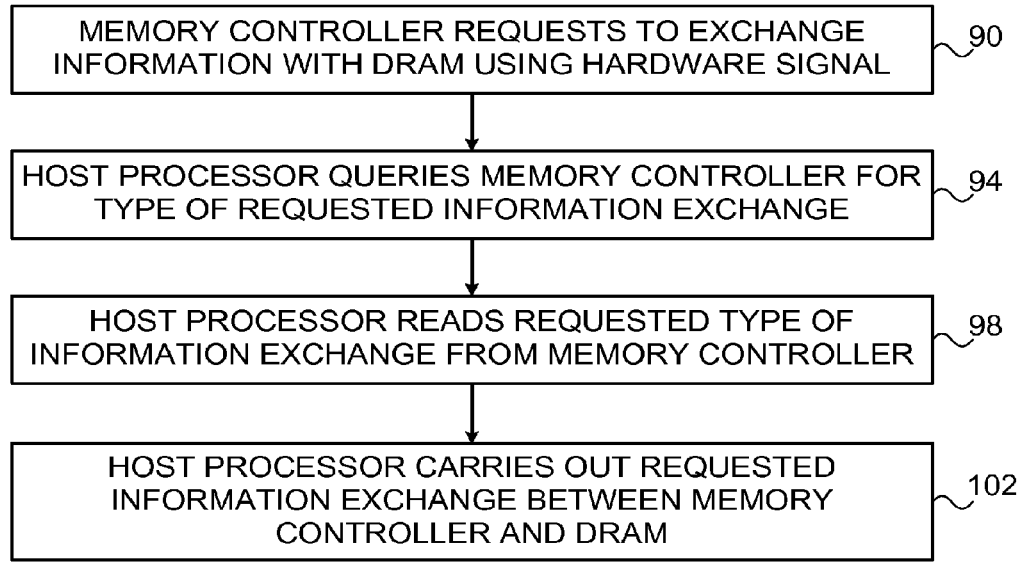
FIG. 3 is a flow chart that schematically illustrates a method for exchanging information between a host processor and a memory controller, in accordance with an embodiment of the present invention.

FIG. 3 is a flow chart that schematically illustrates a method for exchanging information between a host processor and a memory controller, in accordance with an embodiment of the present invention. The method begins with memory controller 32 indicating to host processor 48 that information exchange with DRAM 52 is requested, at an indication step 90. The memory controller signals this indication over a hardware signal (e.g., discrete hardware line or pin) connected between the memory controller and the host processor.

Upon receiving the indication, host processor 48 sends to memory controller 32 a message that queries the type of requested information exchange, at a querying step 94. The querying message requests the memory controller to indicate whether it requests to read information from the DRAM or to store information in the DRAM.

After sending the query message, host processor 48 reads from memory controller 32 data, which indicates the requested type of information exchange, at a readout step 98. For example, the data indicates whether the requested operation reads information from the DRAM or writes information to the DRAM. The data also indicates the range of addresses in DRAM 52 for reading or writing the information. When the request is for storing information in the DRAM, the data also comprises the information to be stored.

Based on the data read from the memory controller at step 98, the host processor carries out the requested information exchange, at an execution step 102. If the memory controller requested to store information in the DRAM, the host processor stores the information at the indicated addresses in the DRAM, and then sends an acknowledgement message to the memory controller. If the memory controller requested to read information from the DRAM, the host processor reads the information from the indicated addresses and sends the information to the memory controller.

In alternative embodiments, the memory controller may exchange information with the DRAM via the host processor using metadata that is included in the host commands and corresponding responses. The memory controller may request information from the DRAM, or send information for storage in the DRAM, by adding metadata to responses sent to the host system (e.g., results of read commands or acknowledgement or write commands). The host processor may send requested information from the DRAM to the memory controller as metadata, which is included in the read or write commands that the host system sends to the memory controller.

In some embodiments, the memory controller and the host processor exchange commands and responses that comprise the applicable DRAM information. For example, when the memory controller reads a certain memory page, it may send the read threshold values used in the read operation to the host processor, together with the read results. In response, the host processor stores the read threshold values in the DRAM. When the host processor sends a read command to the memory controller, it may send the applicable read threshold values (read from the DRAM) to the memory controller as part of the read command.

Although the embodiments described herein mainly address the use of host DRAM, the methods and systems described herein may utilize any other type of host memory, such as Static RAM (SRAM). Additionally or alternatively to assigning and using host memory, the memory controller may use various other resources of the host in order to access the non-volatile memory. For example, the memory controller may use hardware logic circuitry in the host to perform various logical operations (e.g., XOR operations or comparisons) as part of accessing the non-volatile memory. As another example, the memory controller may receive its supply voltage from the host. In such embodiments, the host may provide a stabilized, regulated and/or filtered supply voltage to the memory controller, such that the memory controller can minimize its on-chip regulation, stabilization and/or filtering circuitry. As a result, the power efficiency of the memory controller can be increased and its heat dissipation can be reduced. For example, the memory controller may receive a regulated 1.2V supply voltage from the host, instead of receiving a 1.8V or 3.3V supply voltage and reducing it internally.

As yet another example, the memory controller may invoke the host to perform interference cancellation computations on the data read from the non-volatile memory. In such embodiments, the host may be provided with the read results of one or more pages read from the non-volatile memory, as well as with the read results of neighboring pages. The host may then cancel the interference in the read results based on the read results of the neighboring pages, so as to produce interference-free data.

As still another example, the host can be invoked to perform ECC decoding. In some embodiments, a high-performance ECC decoder (e.g., a soft decoder) can be implemented in the host, using the higher inherent computational complexity of the host, and/or using dedicated hardware. In these embodiments, the memory controller provides the host with code words that are read from the non-volatile memory. The host then decodes the ECC, so as to reconstruct the data. In an example embodiment, the memory controller comprises a certain ECC decoder, and the host comprises another ECC decoder. The decoder in the host is more complex and has a higher error correction capability than the decoder in the memory controller. For example, the decoder in the memory controller may apply hard decoding, whereas the decoder in the host may apply soft decoding. In these embodiments, the memory controller initially attempts to decode a given code word using its local ECC decoder. If the initial attempt fails, the memory controller invokes the higher-performance ECC decoder in the host to decode the code word.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. An apparatus, comprising:
 a memory; and
 a controller coupled to the memory, wherein the controller is configured to:
  receive a command, from a host, to access a range of logical addresses in the memory;
  send a signal to the host, in response to receiving the command, to exchange information with the host wherein the information includes a map of the range of logical addresses to a corresponding range of physical addresses;
  receive a query message from the host, wherein the query message requests a type of information exchange to be performed from the host;
  send the type of information exchange to the host in response to receiving the query message; and
  exchange information with the host dependent upon the type of information exchange to be performed.

2. The apparatus of claim 1, wherein the type of information exchange to be performed includes a transfer of data from the host.

3. The apparatus of claim 1, wherein the type of information exchange to be performed includes a transfer of data to the host.

4. The apparatus of claim 2, wherein the data is initially stored in a volatile memory.

5. The apparatus of claim 2, wherein the controller is further configured to perform an access to the memory dependent upon the received command.

6. The apparatus of claim 5, wherein the data includes at least one read threshold value.

7. A method, comprising:
 receiving, from a host, a command to access a range of logical address in a first memory;
 sending a signal to the host, by the first memory in response to receiving the command, to exchange information with the host responsive to receiving the command, wherein the information includes a map of the range of logical addresses to a corresponding range of physical addresses;
 receiving a query message from the host by the first memory, wherein the query message requests, a type of information exchange to be performed;
 sending the type of information exchange to the host in response to receiving the query message; and
 exchanging information between the first memory and the host dependent upon the type of information exchange to be performed.

8. The method of claim 7, wherein the type of information exchange to be performed includes a transfer of data from the host to the first memory.

9. The method of claim 7, wherein the type of information exchange to be performed includes a transfer of data from the memory to the host.

10. The method of claim 8, further comprising retrieving the data, by the host, from a second memory.

11. The method of claim 9, further comprising storing the data, by the host, in a second memory.

12. The method of claim 10, wherein the first memory comprises a non-volatile memory and the second memory comprises a volatile memory.

13. The method of claim 10, further comprising, performing, by the first memory, an operation dependent upon the data.

14. A system, comprising:
 a processor; and
 a non-volatile memory configured to:
  receive a command from the processor to access a range of logical addresses;

send a signal to the processor in response to receiving the command, to exchange information with the processor, wherein the information includes a map of the range of logical addresses to a corresponding range of physical addresses;

receive, from the processor, a query message that requests a type of information exchange to be performed;

send the type of information exchange to the processor in response to receiving the query message; and exchange information with the host dependent upon the type of information exchange to be performed.

15. The system of claim 14, wherein the type of information exchange to be performed includes a transfer of data from the processor.

16. The system of claim 14, wherein the type of information exchange to be performed includes a transfer of data to the processor.

17. The system of claim 15, further comprising a volatile memory, and wherein the processor is configured to retrieve the data from the volatile memory.

18. The system of claim 15, wherein the non-volatile memory is further configured to perform an operation dependent upon the data.

19. The system of claim 18, wherein the data includes at least one read threshold value.

20. The system of claim 18, wherein to request, in response to the received command, to exchange information with the processor, the non-volatile memory is further configured to send a signal via a ready/busy line.

* * * * *